United States Patent
Kim

(10) Patent No.: US 6,885,320 B2
(45) Date of Patent: Apr. 26, 2005

(54) APPARATUS AND METHOD FOR SELECTING LENGTH OF VARIABLE LENGTH CODING BIT STREAM USING NEURAL NETWORK

(75) Inventor: So-young Kim, Seoul (KR)

(73) Assignee: Samsung Elecetronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/760,400

(22) Filed: Jan. 21, 2004

(65) Prior Publication Data

US 2004/0150538 A1 Aug. 5, 2004

(30) Foreign Application Priority Data

Jan. 21, 2003 (KR) .................................. 10-2003-0004099

(51) Int. Cl.[7] .............................................. H03M 7/40
(52) U.S. Cl. ............................. 341/67; 341/50; 706/44; 704/232
(58) Field of Search ...................... 341/67, 50; 382/156; 706/44; 725/22; 704/232; 375/254, 240.1

(56) References Cited

U.S. PATENT DOCUMENTS

| | | | | |
|---|---|---|---|---|
| 5,333,210 A | * | 7/1994 | Spirkovska et al. | ........ 382/156 |
| 5,546,505 A | * | 8/1996 | Austvold et al. | ............. 706/44 |
| 5,749,066 A | * | 5/1998 | Nussbaum | ................... 704/232 |
| 6,035,177 A | * | 3/2000 | Moses et al. | ................. 725/22 |
| 6,128,346 A | * | 10/2000 | Suarez et al. | ............... 375/254 |
| 6,493,386 B1 | * | 12/2002 | Vetro et al. | .............. 375/240.1 |

\* cited by examiner

Primary Examiner—Jean Bruner Jeanglaude
(74) Attorney, Agent, or Firm—Sughrue Mion, PLLC

(57) ABSTRACT

An apparatus and method for selecting the length of a variable length code bitstream by using a neural network are provided. The apparatus for selecting the length of a variable length code bitstream includes a bitstream estimation length receiving unit which inputs a predetermined quantization DCT coefficient block to a neural network whose training is finished, and receives the estimation length of a bitstream corresponding to the quantization DCT coefficient block from the neural network; and a bitstream estimation length selection unit which receives user selection about an estimation length received by the bitstream estimation length receiving unit. According to the method and apparatus the length of a variable length code bit stream can be estimated such that a user can select a desired length of a bitstream in advance without performing variable length coding.

19 Claims, 14 Drawing Sheets

APPARATUS AND METHOD FOR SELECTING LENGTH OF VARIABLE LENGTH CODING BIT STREAM USING NEURAL NETWORK

This application claims the priority of Korean Patent Application No. 2003-4099, filed on Jan. 21, 2003, in the Korean Intellectual Property Office, the contents of which are incorporated herein by reference in their entirety.

BACKGROUND OF THE INVENTION

1. Field of the Invention

The present invention relates to an apparatus and method for selecting the length of a variable length coding bitstream by using a neural network.

2. Description of the Related Art

FIG. 1 is a diagram of a structure of a conventional video data compression apparatus. The conventional video data compression apparatus comprises a discrete cosine transform (DCT) unit 11, a quantization unit 12, and a variable length coding unit 13.

Digital-type data compression, the compression of video data in particular, is an essential element of a variety of multimedia application environments. However, since a vast amount of information should be processed during video data compression, there are a lot of restrictions in efficiently transmitting, storing, or processing video data. In order to solve these problems, international standards, such as moving picture experts group (MPEG)-2, MPEG-4, H.263, and H.26L, define compression stream syntaxes and decoding processes.

Generally, the compression methods are classified into lossless compression methods and lossy compression methods. If a lossless compression method is used for characters, diagrams, and ordinary data, a complete reconstruction thereof is possible, but the compression ratio is 2 to 1 in average. Meanwhile, if data such as video and audio are compressed by allowing a little loss to the extent that a user cannot perceive the loss, a 10-to-1 or higher compression ratio can be easily obtained. Among lossy encoding techniques for efficiently compressing video data, a transform encoding technique is most widely used. In the basic frame of this method, data which are arranged with high spatial correlations are transformed into frequency components using an orthogonal transformation, ranging from low frequency components to high frequency components. Quantization is performed for each frequency component. At this time, correlation between each frequency component almost disappears and the energy of the signal is concentrated on the low frequency part. Among the frequency domain data obtained by the orthogonal transformation, more bits are allocated for a frequency component in which more energy is concentrated (i.e., where a distribution value is higher) such that the frequency component can be expressed uniformly. Whenever the distribution value increases by four times (that is, the amplitude increases by two times), one more bit is allocated such that all frequency components have identical quantization error characteristics. Among a variety of orthogonal transformations, the Karhunen-Loeve transformation (KLT) has the highest energy concentration characteristic and provides the most efficient compression, theoretically. However, since a transformation should be defined for different pictures in this method, the KLT transform cannot be used practically. A transformation which has a performance close to that of the KLT and can be used practically is the discrete cosine transformation (DCT).

The DCT unit 11 transforms video data into DCT coefficient blocks by DCT transforming video data. In the DCT transformation, each 8×8 array of picture elements is grouped in a block and transformation is performed in units of blocks. Compression ratio increases with increasing size of a block, but the implementation of the transformation becomes much more difficult. Based on experiments, the size of an 8×8 array of picture elements has been selected as a compromise between the performance and ease of implementation. Generally in the prior art compression techniques, in order to remove spatial redundancy when pictures are compressed, DCT transformation is used, and in order to remove temporal redundancy, motion estimation (ME) and motion compensation (MC) are used.

The quantization unit 12 quantizes each of coefficient values of the DCT coefficient blocks by using a Q value, that is, a quantization parameter. At this time, smaller values become 0 such that a little information loss occurs.

The variable length coding unit 13 performs variable length coding (VLC) for data that passed the DCT step and the quantization step. This is the final step of a compression process, in which the DCT transformed quantized coefficients are losslessly compressed. That is, continuously repeated characters (here, 0's) are replaced by an integer string comprising one character corresponding to the numbers of characters, and by zigzag scanning, the generated integer string is transformed into binary numbers. At this time, a VLC table is used so that a short-length code is allocated to a character which has a high probability of occurrence and a long-length code is allocated to a character which has a low probability of occurrence. This is the reason why the coding is referred to as variable length coding (VLC).

After the entire compression process described above, the 8×8 matrix is reduced to some combinations of 0's and 1's. If the compression process is performed reversely, then the compressed video data are decompressed. The video data compression apparatus of FIG. 1 is used for compressing a still picture into a compression file of a joint photographic experts group (JPEG) type, and when moving pictures are compressed into an MPEG format compression file, an apparatus which performs differential pulse code modulation (DPCM) should be added to the video data compression apparatus. By the DPCM, a signal value to be transmitted is estimated based on a signal which was already transmitted, and the difference between the estimated value and an actual value is encoded and then transmitted. For example, if a signal value of point A is used as an estimated value, the difference between the signal value and the signal value of point B is an estimation error. Instead of the signal of point B, this estimation error is encoded and transmitted.

In the prior art, in order to control a bit rate, a quantization parameter, i.e., a Q value, should be adjusted. In order to check whether or not a bit rate desired by a user is output when a Q value is used, the VLC should be performed many times until the desired bit rate is output. However, for the VLC, when a character is mapped to a code, a VLC table should be used every time. This causes heavy computational loads, and accordingly, when a quantized DCT coefficient block which was quantized by a Q value other than the desired Q value is VLC coded, waste of the system resources increases greatly. Likewise, in other cases in which processing related to the length of a bitstream should be performed, the VLC should be performed many times until the desired bit rate is output, and waste of the system resources increases greatly. In this case, the processing is usually performed through parallel hardware, and because each hardware unit should have respective VLC tables, this also increases waste of system resources greatly.

In addition to controlling a bit rate, in some cases, a compressed video packet should satisfy a predetermined limited length. In this case, without VLC coding a next macroblock, the length of the next bitstream after VLC coding cannot be identified. Accordingly, every block should be VLC coded and waste of the system resources increases greatly.

SUMMARY OF THE INVENTION

The present invention provides a method and apparatus by which the length of a bitstream that is a result of variable length coding (VLC) can be estimated such that a user selects the length of a bitstream in advance without performing variable length coding, and then variable length coding is performed.

According to an aspect of the present invention, there is provided a coding data size training apparatus comprising: a training coding data generation unit which generates training coding data by coding training data by a predetermined coding method; and a neural network training unit which inputs training data generated in the training coding data generation unit to an input layer of a neural network, and inputs the size of training coding data obtained by coding the training data by the coding method to an output layer of the neural network so that the neural network is trained.

According to another aspect of the present invention, there is provided a coding data size selection apparatus comprising: a coding data estimation size receiving unit which inputs predetermined data to a neural network whose training is finished, and receives the estimation size of coding data corresponding to the data from the neural network; and an estimation size selection unit which receives user selection about the estimation size received by the coding data estimation size receiving unit.

According to still another aspect of the present invention, there is provided a variable length coding bitstream length training apparatus comprising: a training quantization discrete cosine transformation (DCT) block generation unit which generates a training DCT coefficient block, by DCT of training video data, and generates a training quantization DCT coefficient block by quantizing the generated training DCT coefficient block with a training quantization parameter; a training bitstream generation unit which generates a training bitstream by variable length coding of a training quantization DCT coefficient block generated in the training quantization DCT coefficient block generation unit; and a neural network training unit which trains a neural network by inputting a training quantization DCT coefficient block generated in the training bitstream generation unit to an input layer of the neural network, and inputting the length of a training bitstream generated in the training bitstream generation unit to an output layer of the neural network.

According to yet still another aspect of the present invention, there is provided a variable length coding bitstream length selection apparatus comprising: a bitstream estimation length receiving unit which inputs a predetermined quantization DCT coefficient block to a neural network whose training is finished, and receives the estimation length of a bitstream corresponding to the quantization DCT coefficient block from the neural network; and a bitstream estimation length selection unit which receives user selection about an estimation length received by the bitstream estimation length receiving unit.

According to a further aspect of the present invention, there is provided a parallel variable length coding bitstream length training apparatus comprising: a training quantization DCT coefficient block generation unit which generates a training DCT coefficient block by DCT of training video data, and generates a training quantization DCT coefficient block by quantizing the generated training DCT coefficient block with a training quantization parameter; a training bitstream generation unit which generates a training bitstream by variable length coding of a training quantization DCT coefficient block generated in the training quantization DCT coefficient block generation unit; and a parallel neural network training unit which inputs a training quantization DCT coefficient block generated in the training quantization DCT coefficient block generation unit to input layers of a predetermined number of neural networks arranged in parallel, and inputs the length of a training bitstream generated in the training bitstream generation unit to output layers of the predetermined number of neural networks so that the predetermined number of neural networks are trained.

According to an additional aspect of the present invention, there is provided a parallel variable length coding bitstream length selection apparatus comprising: a parallel bitstream estimation length receiving unit which to each of a predetermined number of neural networks whose training is finished, inputs the predetermined number of quantization DCT coefficient blocks in parallel, the quantization DCT coefficient being obtained by quantizing the predetermined number of DCT coefficient blocks with the predetermined number of quantization parameters, and receives the estimation lengths of the predetermined number of bitstreams corresponding to the predetermined number of quantization DCT coefficient blocks from each of the neural networks; and a bitstream estimation length selection unit which receives user selection about the predetermined number of estimation lengths received by the parallel bitstream estimation length receiving unit.

According to an additional aspect of the present invention, there is provided a video data compression apparatus comprising: a DCT transformation unit which generates a DCT coefficient block by a DCT of predetermined video data; a quantization unit which generates a quantization DCT coefficient block by quantizing a DCT coefficient block generated in the DCT transformation unit with a predetermined quantization parameter; a variable length coding bitstream length selection unit which inputs a quantization DCT coefficient block generated in the quantization unit to a neural network whose training is finished, receives the estimation length of a bitstream corresponding to the quantization DCT coefficient block from the neural network, and receives user selection about the received estimation length; and a bitstream generation unit which, if the estimation length is selected by the user, generates a bitstream by variable length coding a quantization DCT coefficient block corresponding to the selected estimation length.

According to an additional aspect of the present invention, there is provided a coding data size training method comprising: (a) generating training coding data by encoding training data by a predetermined coding method; and (b) inputting training data generated in the training coding data generation unit to an input layer of a neural network, and inputting the size of training coding data obtained by coding the training data by the coding method to an output layer of the neural network so that the neural network is trained.

According to an additional aspect of the present invention, there is provided a coding data size selection method comprising: (a) inputting predetermined data to a neural network whose training is finished, and receiving the estimation size of coding data corresponding to the data from the neural network; and (b) receiving user selection about the received estimation size.

According to an additional aspect of the present invention, there is provided a variable length coding bitstream length training method comprising: (a) generating a training DCT coefficient block by DCT of training video data, and generating a training quantization DCT coefficient block by quantizing the generated training DCT coefficient block with a training quantization parameter; (b) generating a training bitstream by variable length coding the generated training quantization DCT coefficient block; and (c) by inputting the generated training quantization DCT coefficient block to an input layer of the neural network and inputting the length of the generated training bitstream to an output layer of the neural network.

According to an additional aspect of the present invention, there is provided a variable length coding bitstream length selection method comprising: (a) inputting a predetermined quantization DCT coefficient block to a neural network whose training is finished, and receiving the estimation length of a bitstream corresponding to the quantization DCT coefficient block from the neural network; and (b) receiving user selection about the received estimation length.

According to an additional aspect of the present invention, there is provided a parallel variable length coding bitstream length training method comprising: (a) generating a training DCT coefficient block by DCT of training video data, and generating a training quantization DCT coefficient block by quantizing the generated training DCT coefficient block with a training quantization parameter; (b) generating a training bitstream by variable length coding the generated training quantization DCT coefficient block; and (c) inputting the generated training quantization DCT coefficient block to input layers of a predetermined number of neural networks arranged in parallel, and inputting the length of the generated training bitstreams to output layers of the predetermined number of neural networks so that the predetermined number of neural networks are trained.

According to an additional aspect of the present invention, there is provided a parallel variable length coding bitstream length selection method comprising: (a) to each of a predetermined neural networks whose training is finished, inputting the predetermined number of quantization DCT coefficient blocks in parallel, the quantization DCT coefficient being obtained by quantizing the predetermined number of DCT coefficient blocks with the predetermined number of quantization parameters, and receiving the estimation lengths of the predetermined number of bitstreams corresponding to the predetermined number of quantization DCT coefficient blocks from each of the neural networks; and (b) receiving user selection about the predetermined number of the received estimation lengths.

According to an additional aspect of the present invention, there is provided a video data compression method comprising: (a) generating a DCT coefficient block by a DCT of predetermined video data; (b) generating a quantization DCT coefficient block by quantizing the generated DCT coefficient block with a predetermined quantization parameter; (c) inputting the generated quantization DCT coefficient block to a neural network whose training is finished, receiving the estimation length of a bitstream corresponding to the quantization DCT coefficient block from the neural network, and receiving user selection about the received estimation length; and (d) if the estimation length is selected by the user, generating a bitstream by variable length coding a quantization DCT coefficient block corresponding to the selected estimation length.

BRIEF DESCRIPTION OF THE DRAWINGS

The above objects and advantages of the present invention will become more apparent by describing in detail exemplary embodiments thereof with reference to the attached drawings in which.

DESCRIPTION OF THE ILLUSTRATIVE, NON-LIMITING EMBODIMENTS

Figure 1:
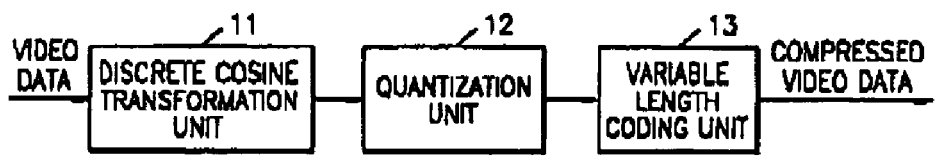
FIG. 1 is a diagram of a structure of a conventional video data compression apparatus.
Figure 2:
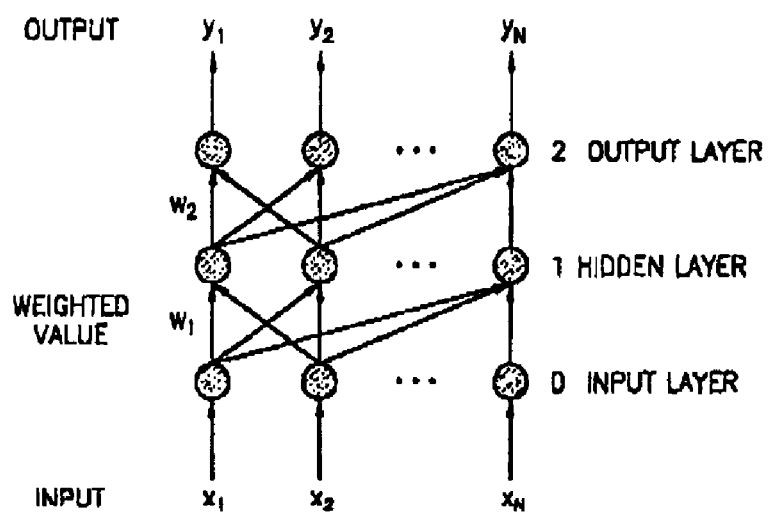
FIG. 2 is a diagram of a structure of a neural network used in the present invention.

FIG. 2 shows a multi-layer perceptron (MLP) neural network, the most widely used among neural networks ever developed so far. Together with a radio basis function (RBF) network, the MLP is a leading static neural network, and is used for recognition, classification, and function approximation by supervised learning. The MLP is a neural network having a layer structure in which one or more middle layers (hidden layers) exist between an input layer and an output layer. Training an MLP is performed by supervised learning, in which a weighted value is adjusted so that a desired output is generated by the network when a class which an input pattern belongs to is known and the input pattern is provided to the network with a correct network output. In other words, an input and a plurality of full sets which accurately know the outputs corresponding to the input are provided as a training pattern to a network, and the difference between the actual output and the desired output of the network of the input pattern is defined as an appropriate objective function, and then a weight value which minimizes the objective function is obtained. At this time, the objective function is expressed by an input, a desired output, and a weighted value. In general, the objective function uses an average square error or a cross entropy error.

$$y = g(W_L h_{L-1}), \text{ for output layer.} \quad (1)$$

$$h_i = g(W_i h_{i-1}), \text{ for the i-th hidden layer.} \quad (2)$$

$$h_i = g(W_i x), \text{ for the 1st hidden layer.} \quad (3)$$

The output of a hidden layer is determined by equations 2 and 3, while the output of the output layer is determined by equation 1. Here, function g is a scalar activation function based on a sigmoid function. It is known that if an objective function is defined as an average square error and minimization of the objective function is achieved for sufficient training patterns, each neuron of the output layer of the MLP approximates an a posteriori probability of a class corresponding to the neuron, or a value in proportion to the a posteriori probability.

Neural networks, including the MLP, have many differences from the conventional methods for processing classification or recognition using statistical principles or based on knowledge. In particular, in the voice recognition or image recognition fields, a neural network has a lot of attractive advantages. First, the neural network has an advantage in that it performs discriminant learning, basically. That is, the MLP reduces an output error value for the input pattern by increasing the output value of a class to which the pattern belongs and decreasing the output values of other classes to which the pattern does not belong. Compared to other methods in which for an input method only the likelihood of a class to which the pattern belongs is maximized, other classes to which the pattern does not belong are also optimized so that a model parameter is not included in a competitor class. Accordingly, the distinction between classes is strengthened. Secondly, the neural network has excellent performance for a voice signal or a video signal having many variations. Thirdly, unlike the conventional sequential methods, due to its structural characteristic, parallel processing is possible and a larger amount of data can be efficiently processed at a time. Fourthly, the neural network shows a stronger characteristic for limited training data, in general.

Figure 3:
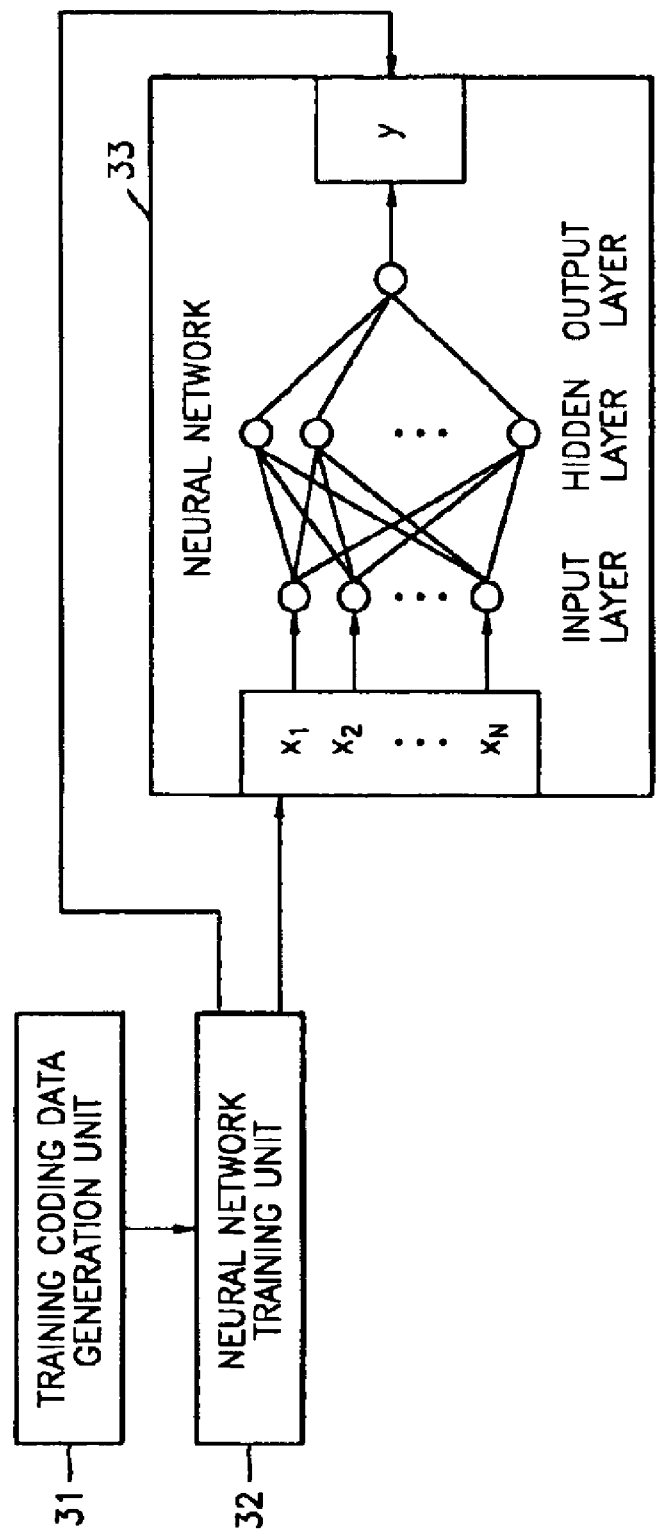
FIG. 3 is a diagram of a structure of a coding data size training apparatus according to an exemplary embodiment of the present invention.

FIG. 3 is a diagram of the structure of a coding data size training apparatus according to an exemplary embodiment of the present invention.

The coding data size training apparatus comprises a training coding data generation unit 31 and a neural network training unit 32. In general, for a product using a neural network, a neural network whose training is finished is used. Accordingly, the coding data size training apparatus may be applied to a production processing step.

The training coding data generation unit 31 codes training data by a predetermined coding method and generates training coding data. Here, the coding method will be one of the coding methods for compressing video data or voice data. For example, the coding method may be a VLC method. The VLC method is a method by which characters that have high probabilities of occurrences are expressed by short codes, such as "0", "1", "01", and "10", and characters that have low probabilities of occurrences are expressed by long codes, such as "0011", and "01010". Here, since the training coding data are for training the neural network 33, the more various values the training coding data have, the more adaptation capability the neural network 33 will have and the better the training effects will be.

The neural network training unit 32 inputs training data to the input layer of the neural network 33 and inputs the size of training coding data, which are coded by the coding method, to the output layer of the neural network 33 so that the neural network 33 can be trained. As described above referring to FIG. 2, the training of a neural network is performed by supervised learning in which a weighted value is adjusted so that a desired output is generated by the network when a class which an input pattern belongs to is known and the input pattern is provided to the network with a correct network output. Here, training data before coding are input to the input layer and training data after coding are input to the output layer. If the coding method is a kind of compression coding method, the coding data size may correspond to the size of compressed data or a motion vector difference.

Figure 4:
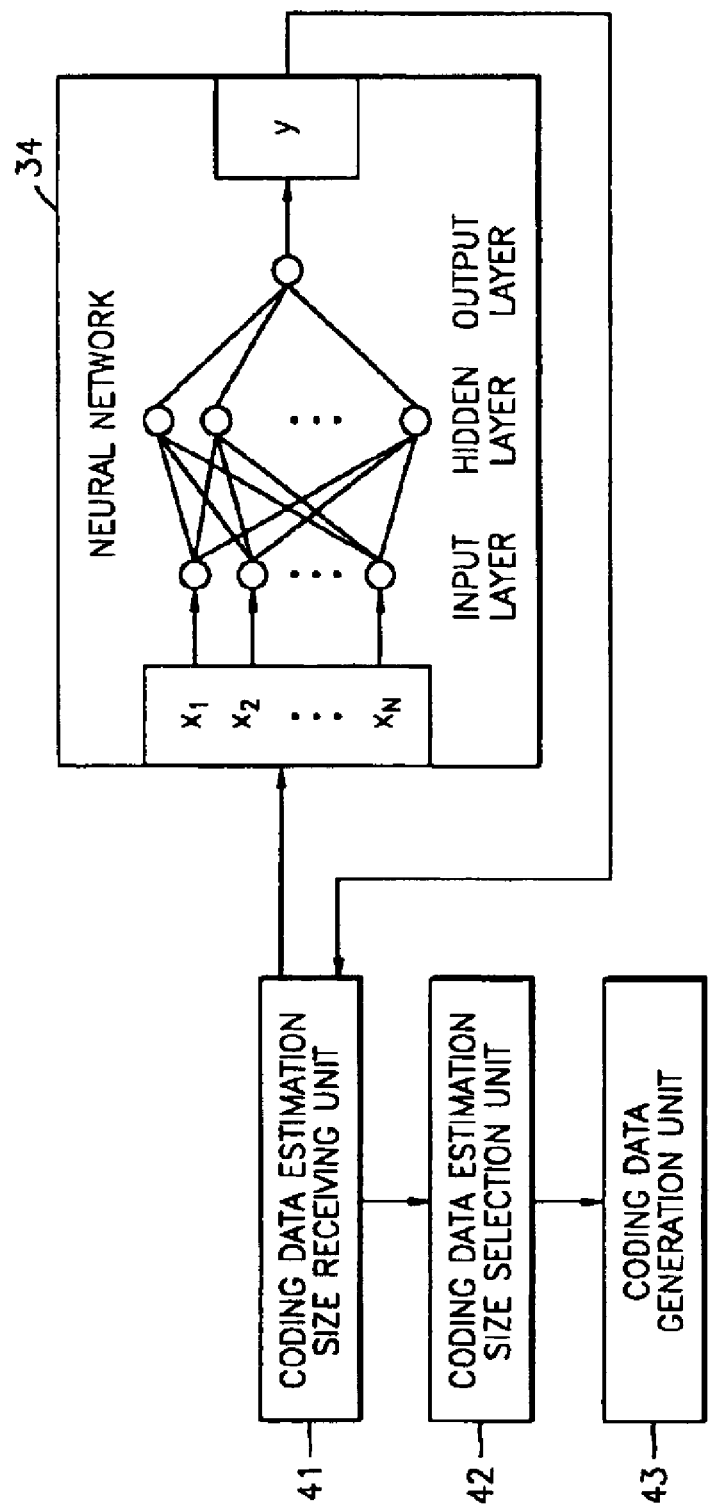
FIG. 4 is a diagram of a structure of a coding data size selection apparatus according to an exemplary embodiment of the present invention.

FIG. 4 is a diagram of the structure of a coding data size selection apparatus according to an exemplary embodiment of the present invention.

The coding data size selection apparatus comprises a coding data estimation size receiving unit 41, a coding data estimation size selection unit 42, and a coding data generation unit 43.

The coding data estimation size receiving unit 41, if training of a neural network 44 is finished, inputs predetermined data to the neural network 44 whose training is finished, and receives the estimation size of coding data corresponding to the data from the neural network 44. If data desired to be coded are input to the neural network 44 whose training is finished, the neural network 44 outputs an estimated size of data, the size which is estimated based on the information trained up to the present as the size of data when the data are coded. The coding data estimation size receiving unit 41 receives the output coding data estimation size.

The coding data estimation size selection unit 42 receives user selection about the estimation size received by the coding data estimation size receiving unit 41. The user finds how big the estimated size will be when data are coded through an image output apparatus or a voice output apparatus (mainly, through an image output apparatus). If the size is the same as the size desired by the user, the user will select it, or else the user will not select it. For example, if the coding method is a kind of compression coding method and an estimation size indicates the size of compressed data desired by the user, the user will select the estimation size. Here, the estimation size may be selected directly by the user using an input tool or automatically via a program written by the user.

The coding data generation unit 43, if the estimation size is selected by the user, codes data corresponding to the selected estimation size by the coding method, and generated coding data. For example, if the estimation size indicates the size of compressed data desired by the user and the user selects this estimation data, then the data are coded by the coding method. That is, in the conventional methods, in order to obtain the desired size of compressed data, data should be compressed for each value to check the result. However, according to the present invention, the size after compression is estimated by using a neural network such that only when a result desired by the user can be obtained, the compression process is performed. Accordingly, the load of compressing data for each value is not needed in order to obtain the desired size of compressed data.

Figure 5:
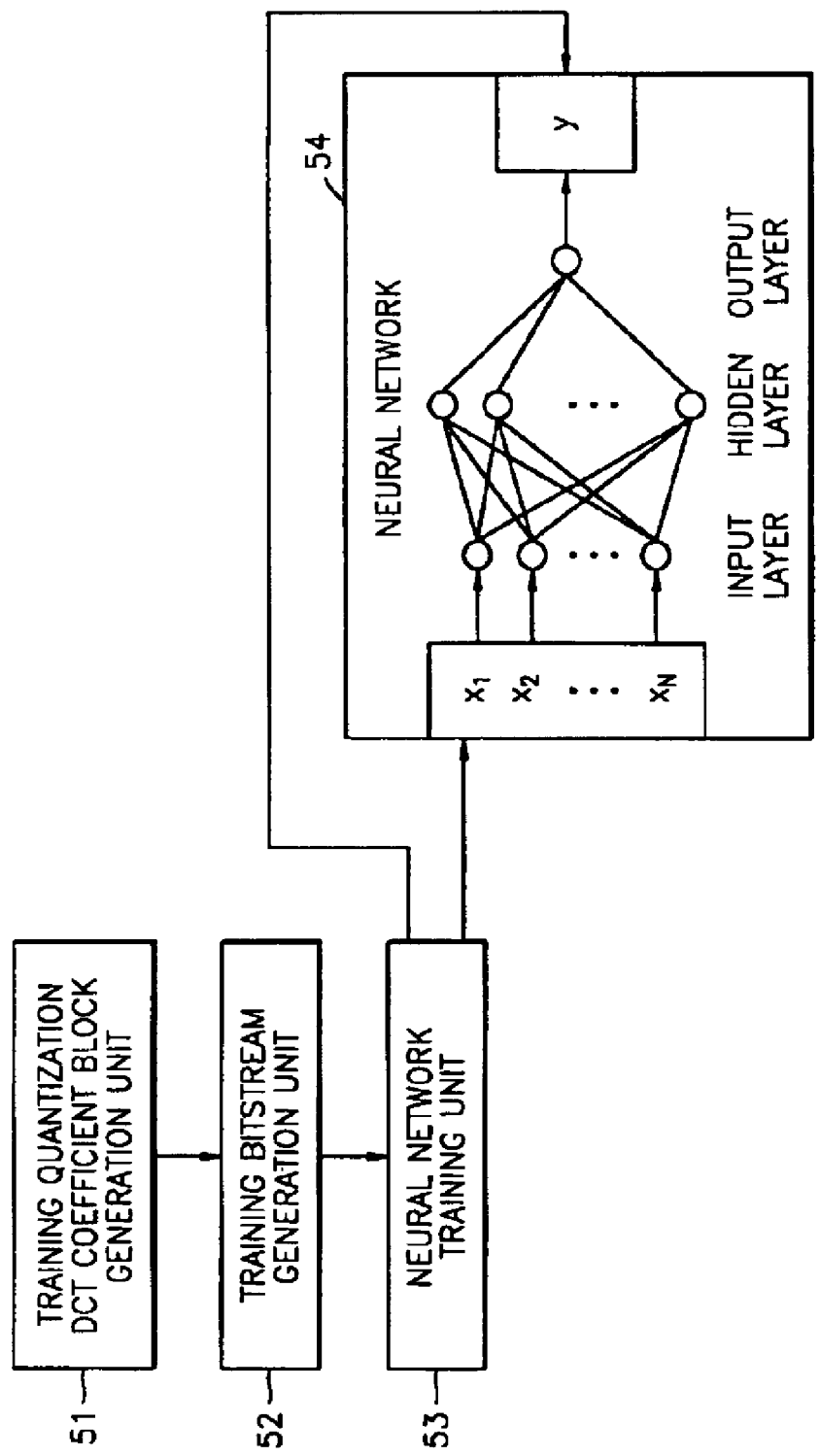
FIG. 5 is a diagram of a structure of a variable length coding bitstream length training apparatus according to an exemplary embodiment of the present invention.

FIG. 5 is a diagram of the structure of a variable length coding bitstream length training apparatus according to an exemplary embodiment of the present invention.

The variable length coding bitstream length training apparatus comprises a training quantization DCT coefficient block generation unit 51, a training bitstream generation unit 52, and a neural network training unit 53. In general, for a product using a neural network, a neural network whose training is finished is used. Accordingly, the variable length coding bitstream length training apparatus may be used in a production processing step.

The training quantization DCT coefficient block generation unit 51 generates training DCT coefficient blocks by a DCT of training video data, and generates training quantization DCT coefficient blocks by quantizing the generated training DCT coefficient blocks with training quantization parameters. Here, training video data indicate an arbitrary video sequence in which when the training video data are DCT transformed, a DCT coefficient block having a variety of values is generated.

A general process for compressing video data will now be explained.

First, original video data are divided into 8×8 blocks and a DCT transformation is performed in units of 8×8 blocks. That is, in the DCT transformation, a time domain video signal is divided into some frequency domains where signal powers are ranging from high frequencies to low frequencies, and then transformed. Here, since information of the video signal is concentrated on the low frequency band, a large number of bits are allocated to the low frequency domain containing much information and a small number of bits are allocated to the high frequency domain containing less information. By doing so, the number of bits used in the high frequency domain is reduced without degradation and compression can be performed effectively. Then, by performing division by a quantization parameter of a predetermined size, a smaller value is made to be "0", and by doing so, quantization for reducing the amount of entire data is performed. At this time, due to the values which become 0 and disappear, there is a little loss of information. Then, run-length encoding, by which continuously repeated characters (here, 0's) are replaced by one character and the length of the characters, is performed. The longer the length of the character is, or the more frequently the repeated characters appear, the higher the compression ratio becomes. Next, Huffman encoding, by which an integer string generated by zigzag scanning is transformed into a binary number, is performed. After the steps described above, the 8×8 matrix is reduced to a combination of 0's and 1's. In order to decompress this compressed video data, the compression process described above is performed reversely. The training quantization DCT coefficient block generation unit 51 performs to the quantization step in the compression process described above.

The training bitstream generation unit 52 generates a training bitstream by variable length coding the training quantization DCT coefficient block generated in the training quantization DCT coefficient block generation unit 51. The training bitstream generation unit 52 performs run-length coding and Huffman coding, which follow the quantization in the compression process described above. In particular, when coding is performed by increasing compression efficiency by allocating a short-length code to a character that has a high probability of occurrence and allocating a long-length code to a character that has a low probability of occurrence, the method is referred to as variable length coding (VLC). At this time, for the corresponding relations between characters and codes, a VLC table is used. If the training quantization DCT coefficient block is variable length coded, a bitstream in which bits of 0 or 1 are continuously arranged is generated.

The neural network training unit 53 inputs the training quantization DCT coefficient block to the input layer of the neural network 54 and inputs the length of the training bitstream which is variable length coded from the training quantization DCT coefficient block to the output of the neural network 54 so that the neural network 54 is trained. Here, the neural network 54 is mainly a 2-layered MLP, but any neural network having a better structure for training video data can be used. As described above referring to FIG. 2, the training of a neural network is performed by supervised learning in which a weighted value is adjusted so that a desired output is generated by the network when a class which an input pattern belongs to is known and the input pattern is provided to the network with a correct network output. Here, the training quantization DCT coefficient block is input to the input layer and the length of the training bitstream is input to the output layer. When training video data are DCT transformed, a DCT coefficient block having a variety of values is generated. Accordingly, the training quantization DCT coefficient block having the variety of values is input to the input layer and, after a training bitstream corresponding to each of training quantization DCT coefficient blocks is obtained from a VLC table, the length of the bitstream is input to the output layer. By doing so, the supervised learning adjusting a weighted value of the neural network 54 is performed. At this time, all values of the 8×8 quantization DCT coefficient block (that is, 64 coefficients) may be input to the neural network 54, but due to the characteristic of a quantization DCT coefficient block, most coefficient values will be 0. Accordingly, by extracting only coefficients that have a value other than 0, the coefficients can be input to the neural network 54. Also, with another purpose, only part of the 8×8 quantization DCT coefficient block may be extracted and input to the neural network 54.

Figure 6:
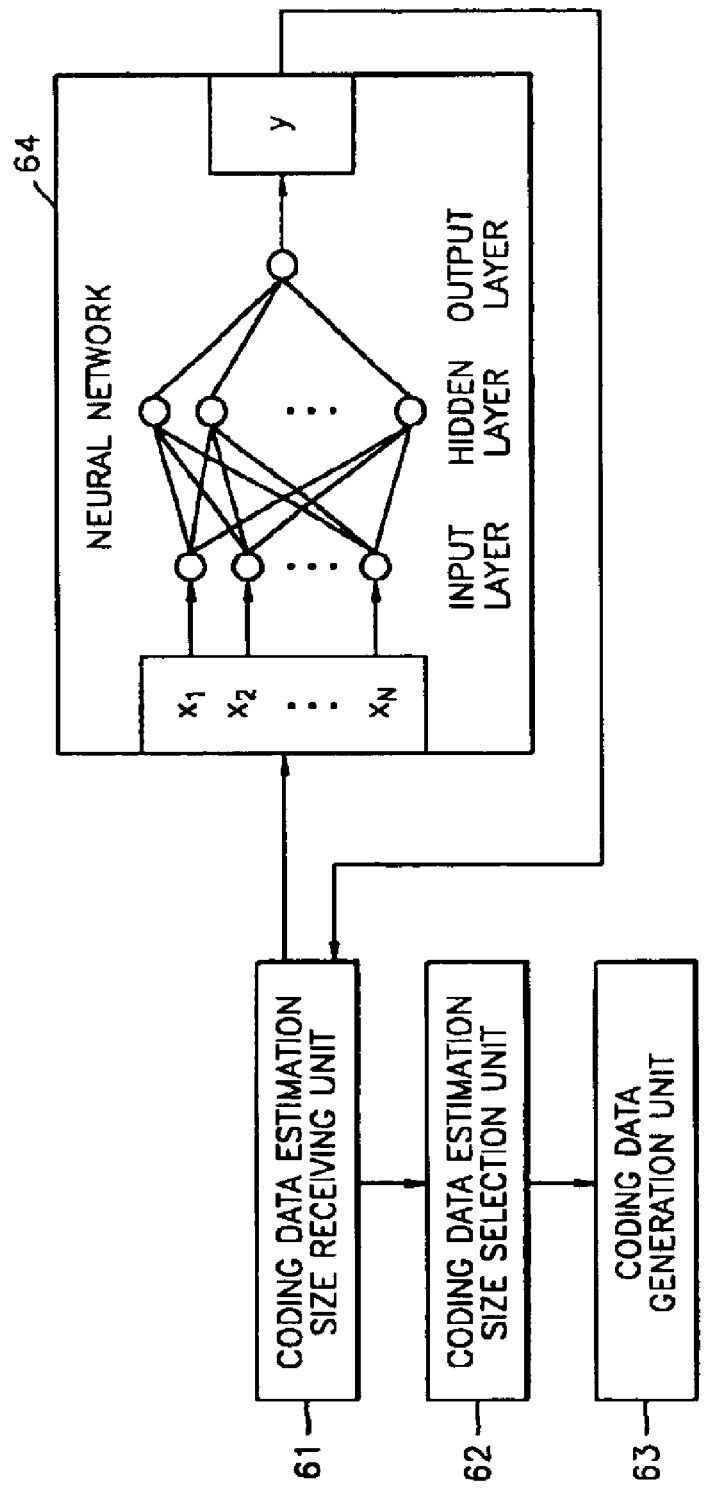
FIG. 6 is a diagram of a structure of a variable length coding bitstream length selection apparatus according to an exemplary embodiment of the present invention.

FIG. 6 is a diagram of the structure of a variable length coding bitstream length selection apparatus according to an exemplary embodiment of the present invention.

The variable length coding bitstream length selection apparatus comprises a bitstream estimation length receiving unit 61, a bitstream estimation length selection unit 62, and a bitstream generation unit 63.

The bitstream estimation length receiving unit 61, if the training of the neural network 64 is finished, inputs a predetermined quantization DCT coefficient block to the neural network whose training is finished, and receives an estimation length of a bitstream corresponding to the quantization DCT coefficient block from the neural network 64. If the quantization DCT coefficient block is input to the neural network 64 whose training is finished, the neural network 64 outputs an estimated length of the bitstream, the length being estimated based on the information trained up to the present as the length of a bitstream obtained when the quantization DCT coefficient block is variable length coded. The bitstream estimation length receiving unit 61 receives the output estimation length of the bitstream. As described above, the VLC coding process is a compression process in which in order to allocate a short-length code to a character that has a high probability of occurrence and allocate a long-length code to a character that has a low probability of occurrence, there is a heavy load of mapping a character to a code by using a VLC table. However, if the present invention is used, internal processing of the neural network is performed by only additions and multiplications as shown in equations 1 through 3, and accordingly, estimation of the length of a bitstream after the VLC is performed by only addition and multiplication without using a VLC table.

At this time, all values of the 8×8 quantization DCT coefficient block (that is, 64 coefficients) may be input to the neural network 64, but due to the characteristic of a quantization DCT coefficient block, most coefficient values will be 0. Accordingly, by extracting only coefficients that have a value other than 0, the coefficients can be input to the neural network 64. Also, with another purpose, only part of the 8×8 quantization DCT coefficient block may be extracted and input to the neural network 64.

The bitstream estimation length selection unit 62 receives user selection about the estimation length received by the bitstream estimation length receiving unit 61. The user finds how long the estimated length will be when data are coded, through an image output apparatus or a voice output apparatus (mainly, through an image output apparatus). If the length is the same as the length desired by the user, the user will select it, or else the user will not select it. For example, if an estimation length indicates the size desired by the user, of compressed data, the user will select the estimation length. Here, the user may directly select the estimation length using an input tool, or the estimation length may be selected automatically via a program written by the user.

The bitstream generation unit 63, if the estimation length is selected by the user, generates a bitstream by variable length coding a quantization DCT coefficient block corresponding to the selected estimation length. If the estimation length indicates the size of compressed data desired by the user and the user selects this estimation length, then the data are variable length coded. That is, in order to obtain the desired size of variable length coded data, data should be variable length coded to check the result in the conventional methods. However, according to the present invention, the length of a bitstream after variable length coding is estimated by using a neural network such that only when a result desired by the user can be obtained, the variable length coding process is performed. Accordingly, the load of performing variable length coding for each value is not needed in order to obtain the desired length of variable length coded data. That is, quantization DCT coefficients that are quantized by applying a variety of quantization parameters, that is, a variety of Q values, are input to the neural network. As a result, by variable length coding quantization DCT coefficients to which Q value which leads a result closest to the target bit rate of the user is applied, a bit rate closest to the bit rate desired by the user can be obtained. Consequently, by predicting which Q value, if applied, leads a bit rate closest to the bit rate desired by the user, the bit rate can be controlled faster and more efficiently.

Figure 7:
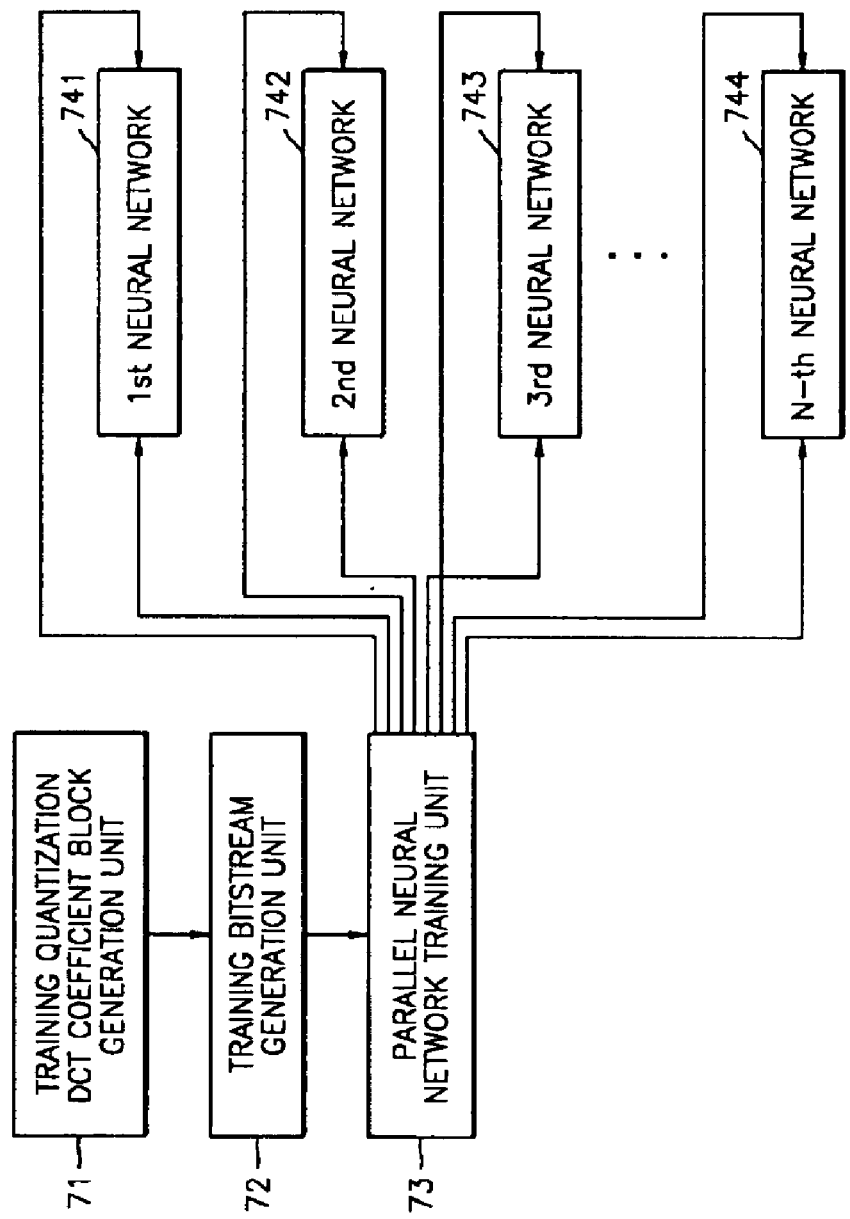
FIG. 7 is a diagram of a structure of a parallel variable length coding bitstream length training apparatus according to an exemplary embodiment of the present invention.

FIG. 7 is a diagram of a structure of a parallel variable length coding bitstream length training apparatus according to an exemplary embodiment of the present invention.

The parallel variable length coding bitstream length training apparatus comprises a training quantization DCT coefficient block generation unit 71, a training bitstream generation unit 72, and a parallel neural network training unit 73. In general, for a product using a neural network, a neural network whose training is finished is used. Accordingly, the variable length coding bitstream length training apparatus may be used in a production processing step.

The training quantization DCT coefficient block generation unit 71 generates a training DCT coefficient block by a DCT of training video data, and generates a training quantization DCT coefficient block, by quantizing the generated training DCT coefficient block with a quantization parameter. Here, the training video data are an arbitrary video sequence in which when the training video data are DCT transformed, a DCT coefficient block having a variety of values is generated. The training quantization DCT coefficient block generation unit 71 generates training quantization DCT coefficient blocks having a variety of values by quantizing DCT coefficient blocks having a variety of values.

The training bitstream generation unit 72 generates a training bitstream by variable length coding the training quantization DCT coefficient block generated in the training quantization DCT coefficient block generation unit 71. If the training quantization DCT coefficient block is variable length coded, a bitstream in which bits of 0 or 1 are continuously arranged is generated.

The parallel neural network training unit 73 inputs training quantization DCT coefficient blocks to the input layers of a predetermined number of neural networks arranged in parallel, and inputs the length of the training bitstream, which is obtained by variable length coding the training quantization DCT coefficient block, to the output layers of the predetermined number of neural network, so that the predetermined number of neural networks can be trained. For example, if N neural networks 741 through 744 are arranged in parallel as shown in FIG. 7, a training quantization DCT coefficient block and the length of a training bitstream are input to each of the neural networks such that the N neural networks 741 through 744 are trained at the same time. Here, the neural networks are mainly 2-layered MLPs.

Figure 8:
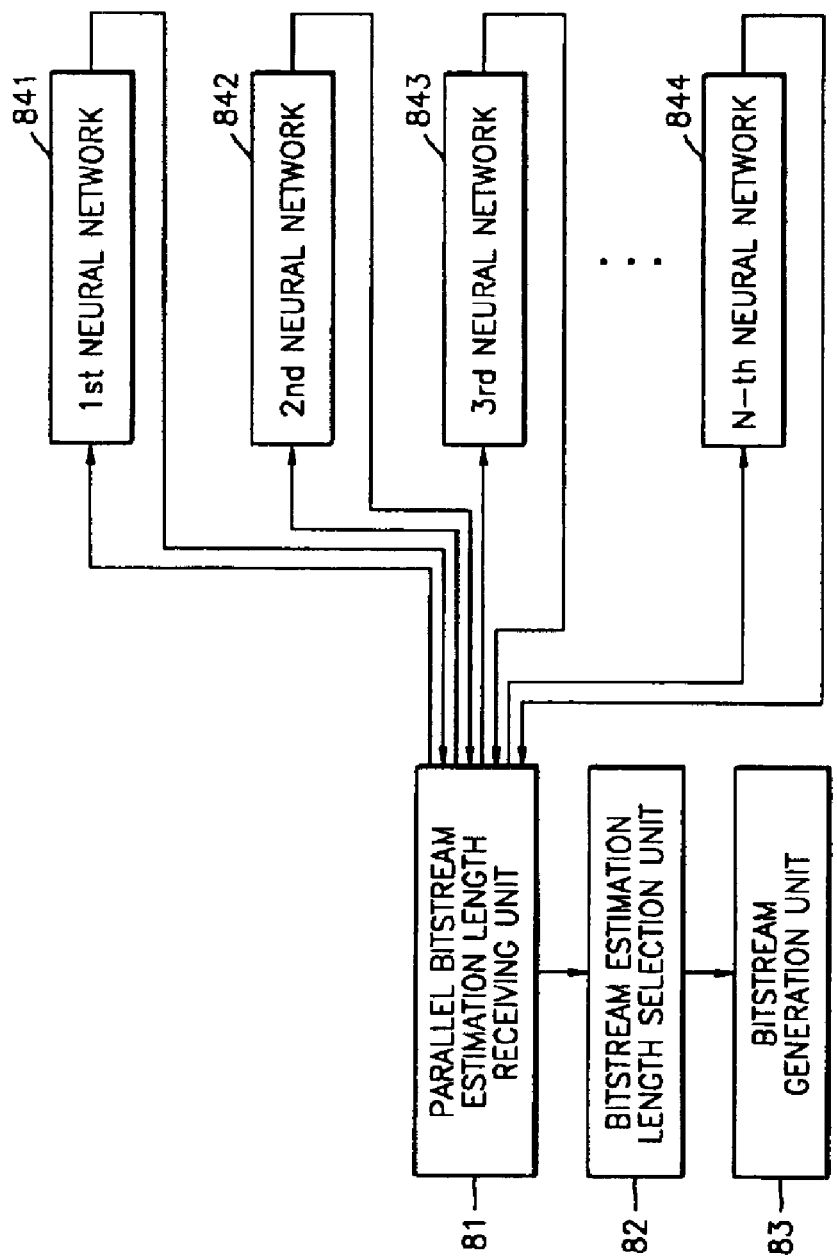
FIG. 8 is a diagram of a structure of a parallel variable length coding bitstream length selection apparatus according to an exemplary embodiment of the present invention.

FIG. 8 is a diagram of the structure of a parallel variable length coding bitstream length selection apparatus according to an exemplary embodiment of the present invention.

The parallel variable length coding bitstream length selection apparatus comprises a parallel bitstream estimation length receiving unit 81, a bitstream estimation length selection unit 82, and a bitstream generation unit 83.

The parallel bitstream estimation length receiving unit 81, if training of the predetermined number of neural networks is finished, inputs in parallel the predetermined number of quantization DCT coefficient blocks which are quantized by predetermined number of quantization parameters, by using the predetermined number DCT coefficient blocks, to each of the predetermined number of neural networks whose training is finished. The parallel bitstream estimation length receiving unit 81 receives the estimation lengths of the predetermined number of bitstreams corresponding to the quantization DCT coefficient blocks from respective neural networks.

By dividing an image desired to be compressed into an 8×8 block and performing DCT transformations in units of 8×8 blocks, a DCT coefficient block is generated and quantized, and a value smaller than the quantization parameter becomes 0. At this time, due to the values which become 0 and disappear, there is a little loss of information. Then, run-length encoding, by which continuously repeated characters (here, 0's) are replaced by one character and the length of the characters, is performed. The longer the length of the character is, or the more frequently the repeated characters appear, the higher the compression ratio becomes. Accordingly, the bigger a quantization parameter is, the more DCT coefficients become 0, and the higher compression ratio becomes. Meanwhile, whether or not data are compressed into a size desired by the user can be found only after the last step of compression, that is, after performing variable length coding. According to the present invention, if a quantization DCT coefficient block is input to a neural network whose training is finished, the neural network outputs the estimation length of a bitstream, the length which is based on the information trained up to the present, as the length of a bitstream to be obtained when the quantization DCT coefficient block is variable length coded. Accordingly, quantization DCT coefficient blocks quantized by a variety of quantization parameters are input to N neural networks 841 through 844, and the N neural networks 841 through 844 output a variety of estimation lengths of bitstreams corresponding to the variety of quantization DCT coefficient blocks.

The bitstream estimation length selection unit 82 receives user selection about the predetermined number of estimation lengths received by the parallel bitstream estimation length receiving unit 81. The user finds how long the estimated length of a bitstream will be when the quantization DCT coefficients are variable length coded, through an image output apparatus or a voice output apparatus (mainly, through an image output apparatus). If the length is the same as the length desired by the user, the user will select it, or else the user will not select it. For example, if an estimation length indicates the size desired by the user, of compressed data, the user will select the estimation length. Here, the user may directly select the estimation length using an input tool, or the estimation length may be selected automatically via a program written by the user.

The bitstream generation unit 83, if any one of the predetermined number of estimation lengths is selected by the user, generates a bitstream by variable length coding a quantization DCT coefficient block corresponding to the selected estimation length. If an estimation length indicates the size desired by the user of compressed data, and the user selects this estimation length, then variable length coding will be performed. That is, in order to obtain the desired size of variable length coded data, all quantization DCT coefficient blocks should be variable length coded to check the result in the conventional methods. However, according to the present invention, the length of a bitstream after variable length coding is estimated by using a neural network such that only when a result desired by the user can be obtained, the variable length coding process is performed. Accordingly, the load of performing variable length coding for each value is not needed in order to obtain the desired length of variable length coded data.

Figure 9:
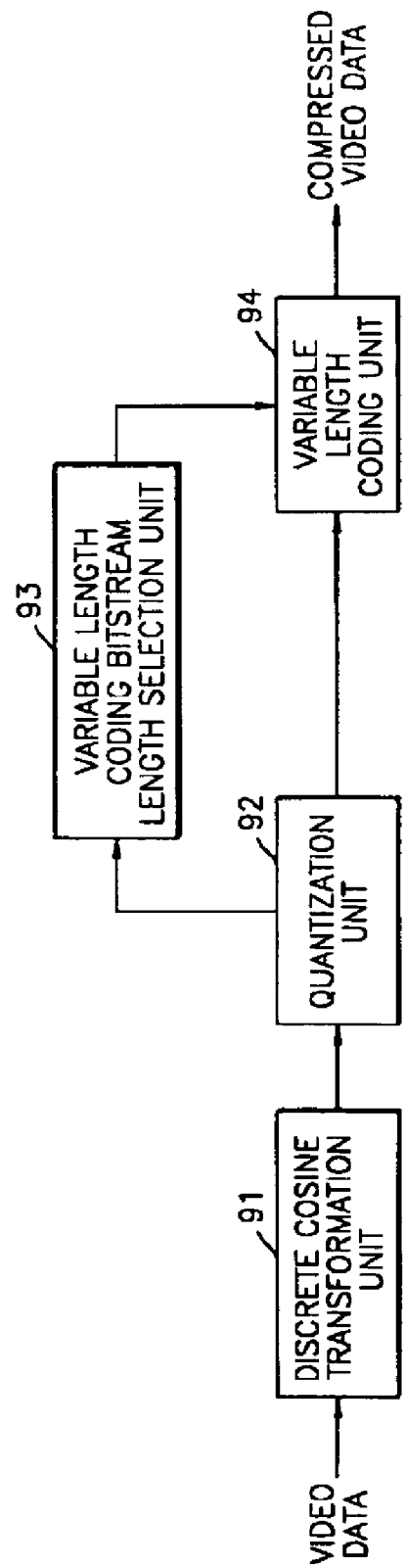
FIG. 9 is a diagram of a structure of a video data compression apparatus according to an exemplary embodiment of the present invention.

FIG. 9 is a diagram of a structure of a video data compression apparatus according to an exemplary embodiment of the present invention.

The video data compression apparatus comprises a DCT transform unit 91, a quantization unit 92, a variable length coding (VLC) bitstream length selection unit 93, and a bitstream generation unit 94.

The DCT transform unit 91 generates a DCT coefficient block by a DCT of predetermined video data. An image desired to be compressed is divided into 8×8 blocks and DCT transform is performed in units of 8×8 blocks. If a DCT transformation is performed, a large number of bits are allocated to a low frequency domain containing much information and a small number of bits are allocated to a high frequency domain containing less information. Here, video data indicate a video sequence desired to be compressed.

The quantization unit 92 generates a quantization DCT coefficient block, by quantizing the DCT coefficient block generated in the DCT transform unit 91, with a predetermined quantization parameter. By performing division by a quantization parameter of a predetermined size, a smaller value is made to be "0", and by doing so, quantization for reducing the amount of entire data is performed. At this time, due to the values which become 0 and disappear, there is a little loss of information.

The VLC bitstream length selection unit 93 inputs the quantization DCT coefficient block generated by the quantization unit 92 to the neural network whose training is finished, and receives the estimation length of a bitstream corresponding to the quantization DCT coefficient block, from the neural network, and receives user selection about the received estimation length. Here, the neural network is mainly a 2-layered MLP.

The bitstream generation unit 94, if a received estimation length is selected by the user, generates a bitstream by variable length coding a quantization DCT coefficient block corresponding to the selected estimation length. If an estimation length indicates the size of compressed data desired by the user, and the user selects this estimation length, then variable length coding will be performed. That is, in order to obtain the desired size of variable length coded data, all quantization DCT coefficient blocks should be variable length coded to check the result in the conventional methods. However, according to the present invention, the length of a bitstream after variable length coding is estimated by using a neural network such that only when a result desired by the user can be obtained, the variable length coding process is performed. Accordingly, the load of performing variable length coding for each value is not needed in order to obtain the desired length of variable length coded data.

The video data compression apparatus of FIG. 9 is used for compressing a still picture into a compression file of a joint photographic experts group (JPEG) type, and when moving pictures are compressed into an MPEG format compression file, an apparatus which performs differential pulse code modulation (DPCM) should be added to the video data compression apparatus. By the DPCM, a signal value to be transmitted is estimated based on a signal which was already transmitted, and the difference between the estimated value and an actual value is encoded and then transmitted. For example, if a signal value of point A is used as an estimated value, the difference between the signal value and the signal value of point B is an estimation error. Instead of the signal of point B, this estimation error is encoded and transmitted.

Figure 10:
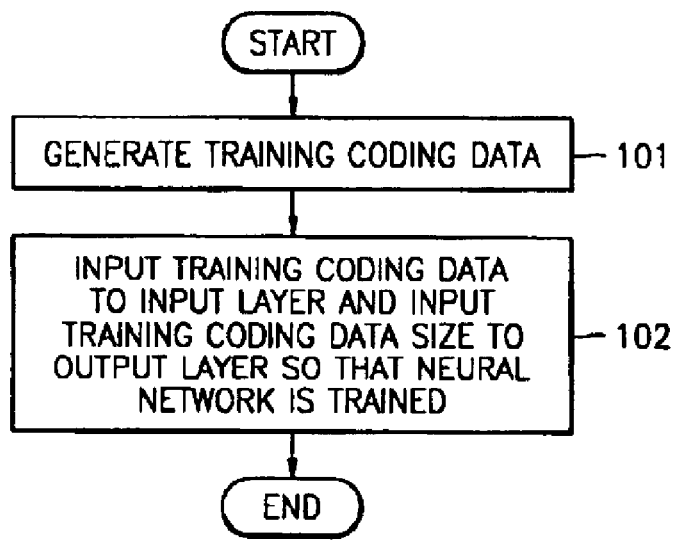
FIG. 10 is a flowchart of a coding data size training method according to an exemplary embodiment of the present invention.

FIG. 10 is a flowchart of a coding data size training method according to an exemplary embodiment of the present invention.

Training coding data are generated by coding training data by a coding method in step 101. Next, training data are input to the input layer of a neural network, and the size of training coding data obtained by coding the training data by a predetermined coding method is input to the output layer of the neural network so that the neural network is trained in step 102.

Figure 11:
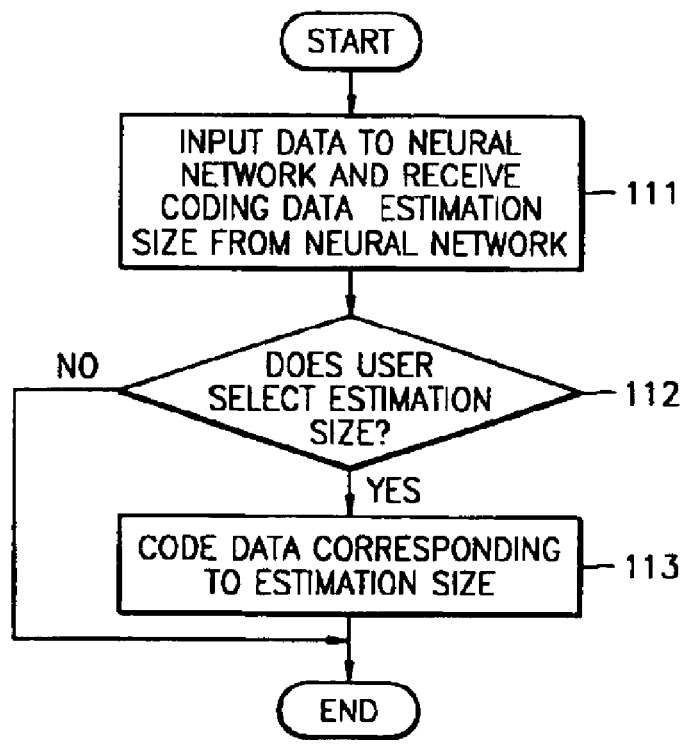
FIG. 11 is a flowchart of a coding data size selection method according to an exemplary embodiment of the present invention.

FIG. 11 is a flowchart of a coding data size selection method according to an exemplary embodiment of the present invention.

Predetermined data are input to a neural network whose training is finished and the estimation size of coding data corresponding to the data from the neural network is received in step 111. Then, about the received estimation size, user selection is received in step 112. Next, if the estimation size is selected by the user in step 112, by coding the data by the coding method, coded data are generated in step 113.

Figure 12:
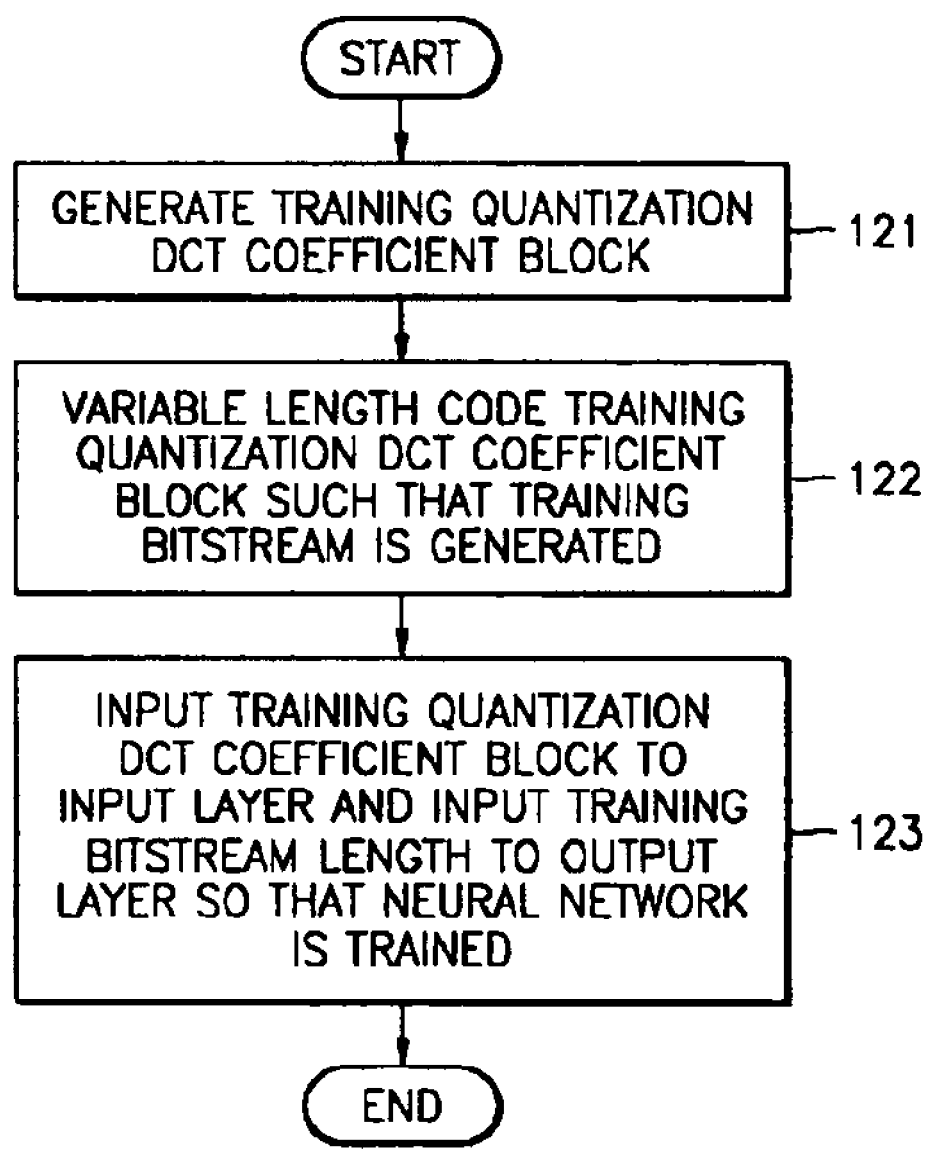
FIG. 12 is a flowchart of a variable length coding bitstream size training method according to an exemplary embodiment of the present invention.

FIG. 12 is a flowchart of a variable length coding bitstream size training method according to an exemplary embodiment of the present invention.

By a DCT of training video data, a training DCT coefficient block is generated and by quantizing the generated training DCT coefficient block with a training quantization parameter, a training quantization DCT coefficient block is generated in step 121. Here, the training video data indicate an arbitrary video sequence in which when the training video data are DCT transformed, a DCT coefficient block having a variety of values is generated. Next, by variable length coding the generated training quantization DCT coefficient block, a training bitstream is generated in step 122. Then, the training quantization DCT coefficient block is input to the input layer of the neural network, and the length of the training bitstream obtained by variable length coding the training quantization DCT coefficient block is input to the output layer of the neural network so that the neural network can be trained in step 123. Here, the neural network is mainly a 2-layered MLP.

Figure 13:
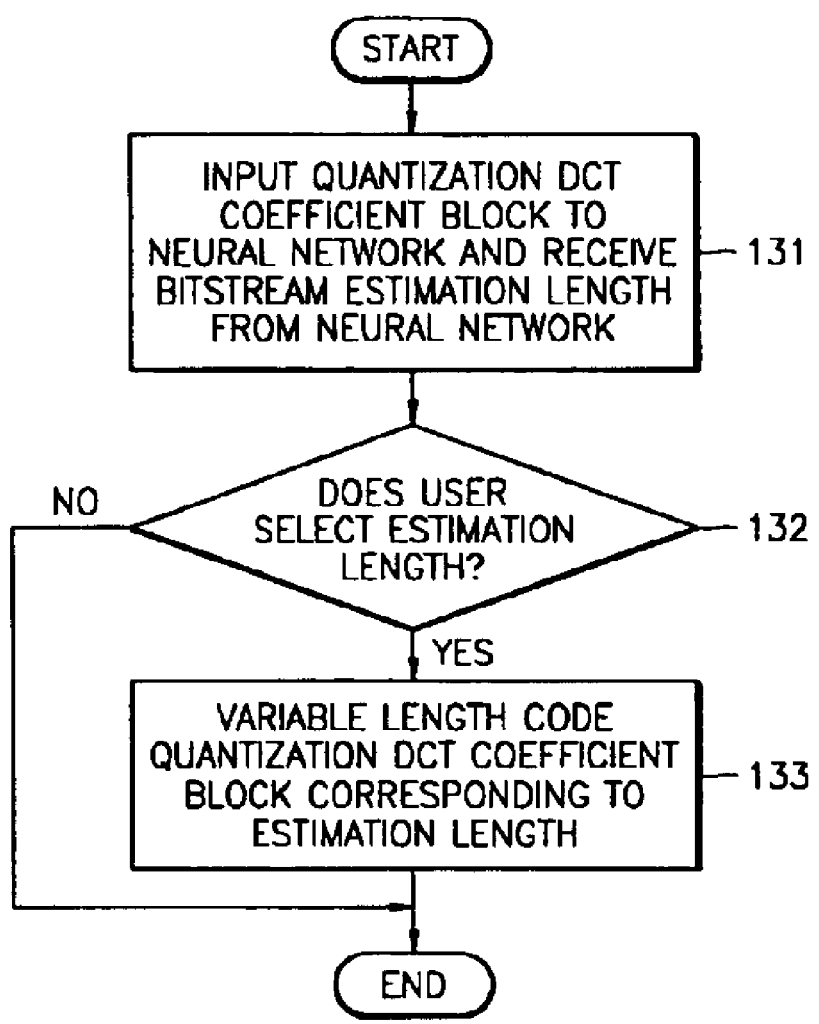
FIG. 13 is a flowchart of a variable length coding bitstream size selection method according to an exemplary embodiment of the present invention.

FIG. 13 is a flowchart of a variable length coding bitstream size selection method according to an exemplary embodiment of the present invention.

A predetermined quantization DCT coefficient block is input to a neural network whose training is finished, and the estimation length of a bitstream corresponding to the quantization DCT coefficient block from the neural network is received in step 131. Then, user selection regarding the received estimation length is received in step 132. Next, if the estimation length is selected by the user in step 132, by variable length coding a quantization DCT coefficient block corresponding to the selected estimation length, a bitstream is generated in step 133.

Figure 14:
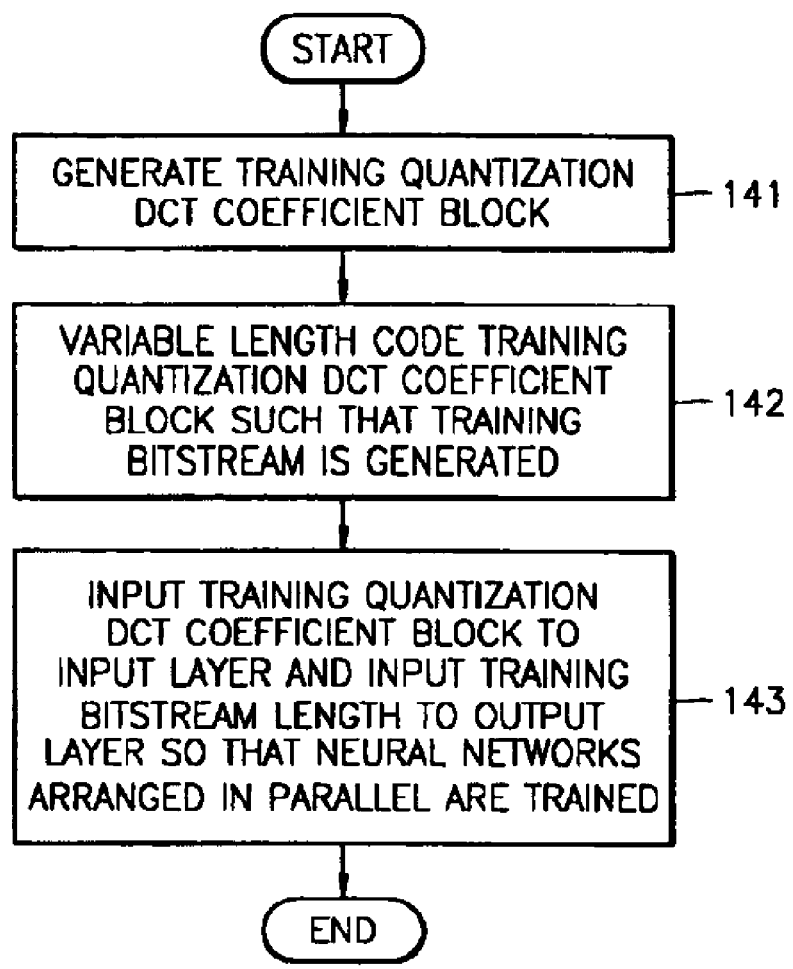
FIG. 14 is a flowchart of a parallel variable length coding bitstream size training method according to an exemplary embodiment of the present invention.

FIG. 14 is a flowchart of a parallel variable length coding bitstream size training method according to an exemplary embodiment of the present invention.

By a DCT of training video data, a training DCT coefficient block is generated and by quantizing the generated training DCT coefficient block with a training quantization parameter, a training quantization DCT coefficient block is generated in step 141. Here, the training video data indicate an arbitrary video sequence in which when the training video data are DCT transformed, a DCT coefficient block having a variety of values is generated. Next, by variable length coding the generated training quantization DCT coefficient block, a training bitstream is generated in step 142. Then, the training quantization DCT coefficient block is input to the input layers of a predetermined number of neural networks arranged in parallel, and the length of the training bitstream obtained by variable length coding the training quantization DCT coefficient block is input to the output layers of the predetermined number of neural networks so that the predetermined neural networks can be trained in step 143. Here, the neural networks are mainly 2-layered MLPs.

Figure 15:
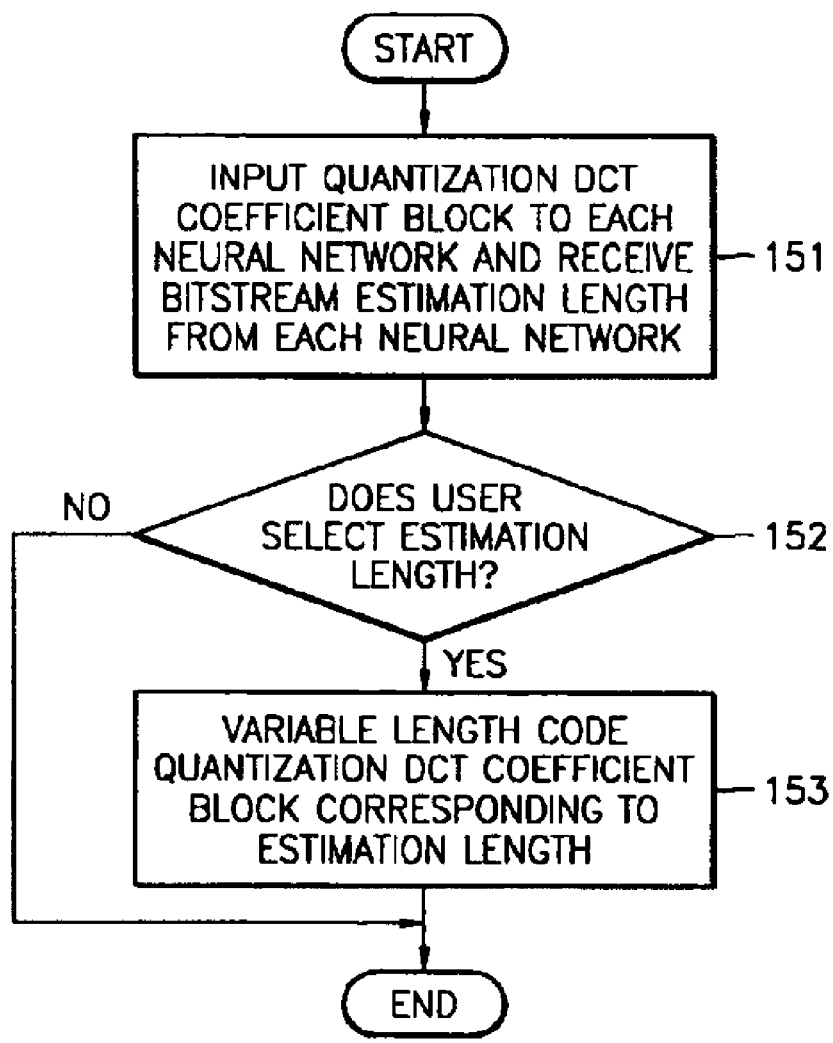
FIG. 15 is a flowchart of a parallel variable length coding bitstream size selection method according to an exemplary embodiment of the present invention.

FIG. 15 is a flowchart of a parallel variable length coding bitstream size selection method according to an exemplary embodiment of the present invention.

A predetermined number of quantization DCT coefficient blocks, obtained by quantizing the predetermined number of DCT coefficient blocks with the predetermined number of quantization parameters, are input to the predetermined number of neural networks in parallel, and estimation lengths of the predetermined number of bitstreams corresponding to the predetermined number of quantization DCT coefficient blocks from the neural networks are received in step 152. Then, user selection regarding the received predetermined number of estimation lengths is received in step 12. Next, if any one of the predetermined number of estimation lengths is selected by the user in step 152, a bitstream is generated by variable length coding a quantization DCT coefficient block corresponding to the selected estimation length in step 153.

Figure 16:
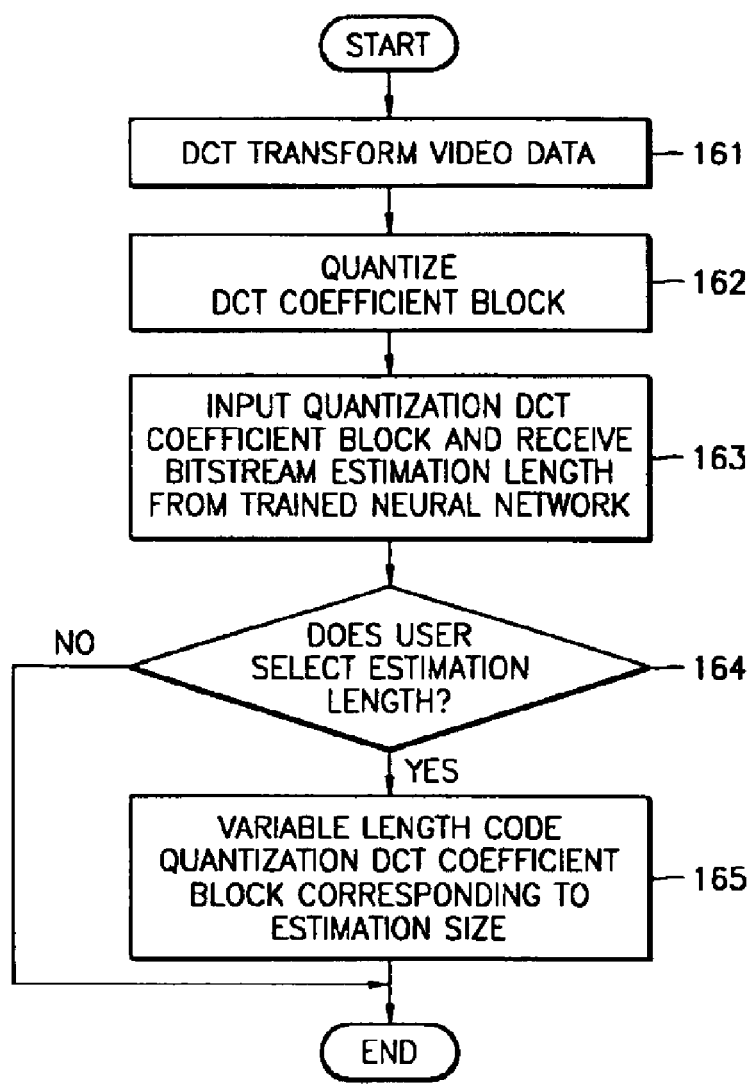
FIG. 16 is a flowchart of a video data compression method according to an exemplary embodiment of the present invention.

FIG. 16 is a flowchart of a video data compression method according to an exemplary embodiment of the present invention.

By a DCT of predetermined video data, a DCT coefficient block is generated in step 161. Here, video data indicate a video sequence desired to be compressed. Then, by quantizing the generated DCT coefficient block with a predetermined quantization parameter, a quantization DCT coefficient block is generated in step 162. Next, a training quantization DCT coefficient block is input to the input layer of a neural network and the length of a training bitstream obtained by variable length coding the training quantization DCT coefficient block is input to the output layer of the neural network so that the neural network can be trained. If the training of the neural network is finished, the generated quantization DCT coefficient block is input to the neural network whose training is finished, the estimation length of a bitstream corresponding to the quantization DCT coefficient block from the neural network is received in step 163. About the received estimation length, user selection is received in step 164. Here, the neural network is mainly a 2-layered MLP. Then, if the received estimation length is selected by the user in step 164, a bitstream is generated by variable length coding the quantization DCT coefficient block corresponding to the selected estimation length in step 165.

The present invention may be embodied in a code, which can be read by a computer, on a computer readable recording medium. The computer readable recording medium includes all kinds of recording apparatuses on which computer readable data are stored.

The computer readable recording media includes storage media such as magnetic storage media (e.g., ROM's, floppy disks, hard disks, etc.), optically readable media (e.g., CD-ROMs, DVDs, etc.) and carrier waves (e.g., transmissions over the Internet).

Exemplary embodiments have been shown and explained above. However, the present invention is not limited to the exemplary embodiments described above, and it is apparent that variations and modifications by those skilled in the art can be effected within the spirit and scope of the present invention defined in the appended claims. Therefore, the scope of the present invention is not determined by the above description but by the accompanying claims.

According to the present invention, by using a neural network, the length of a variable length code bit stream can be estimated such that a user can select a desired length of a bitstream in advance without performing variable length coding. That is, it is not needed that variable length coding is performed for each Q value, and it can be predicted that which Q value, if applied, provides a result closest to a target bit rate such that bit rate control can be performed faster and more efficiently. In particular, a VLC table should be used for the VLC coding process in the conventional method, which causes a heavy load and in turn waste of the system increases greatly. By using a neural network which performs only additions and multiplications, estimation of the length of a bitstream which is a result of VLC coding is enabled such that a huge waste of the system can be prevented.

In addition, in order to quickly find a desired bit rate, parallel hardware processing is generally used, and in this case, each hardware unit does not need to have a VLC table such that a huge waste of the system can be prevented. Furthermore, the present invention can be used for estimating the result of variable length coding other coefficients, for example, a motion vector difference, in addition to estimating the result of variable length coding a quantization DCT coefficient block. That is, the present invention can be applied to a variety of applications in which the length of a bitstream is desired to be found without performing variable length coding,

What is claimed is:

1. A coding data size training apparatus comprising:
   a training coding data generation unit which generates training coding data by coding training data by a predetermined coding method; and
   a neural network training unit which inputs the training data to an input layer of a neural network, and inputs the size of the training coding data to an output layer of the neural network so that the neural network is trained.

2. A coding data size selection apparatus comprising:
   a coding data estimation size receiving unit which inputs predetermined data to a neural network whose training is finished, and receives an estimation size of coding data corresponding to the predetermined data from the neural network; and
   an estimation size selection unit which receives a user selection regarding the estimation size received by the coding data estimation size receiving unit.

3. The apparatus of claim 2, further comprising:
   a coding data generation unit which, if the estimation size is selected by the user, generates coding data by encoding data corresponding to the selected estimation size by a coding method.

4. A parallel variable length coding bitstream length training apparatus comprising:
   a training quantization DCT coefficient block generation unit which generates a training DCT coefficient block by a DCT of training video data, and generates a training quantization DCT coefficient block by quantizing the generated training DCT coefficient block with a training quantization parameter;
   a training bitstream generation unit which generates a training bitstream, by variable length coding a training quantization DCT coefficient block generated in the training quantization DCT coefficient block generation unit; and
   a parallel neural network training unit which inputs the training quantization DCT coefficient block to input layers of a predetermined number of neural networks arranged in parallel, and inputs the length of the training bitstream to output layers of the predetermined number of neural networks so that the predetermined number of neural networks are trained.

5. The apparatus of claim 4, wherein the training video data comprise an arbitrary video sequence, in which if the training video data are DCT transformed, a DCT coefficient block having a variety of values is generated.

6. A coding data size selection method comprising:
   (a) inputting predetermined data to a neural network whose training is finished, and receiving the estimation size of coding data corresponding to the predetermined data from the neural network; and
   (b) receiving a user selection about the received estimation size.

7. The method of claim 6, further comprising:
   (c) if the estimation size is selected by the user, generating coding data by encoding data corresponding to the selected estimation size by a coding method.

8. A variable length coding bitstream length training method comprising:
   (a) generating a training DCT coefficient block by a DCT of training video data, and generating a training quantization DCT coefficient block by quantizing the generated training DCT coefficient block with a training quantization parameter;
   (b) generating a training bitstream by variable length coding the generated training quantization DCT coefficient block; and
   (c) inputting the generated training quantization DCT coefficient block to an input layer of the neural network and inputting the length of the generated training bitstream to an output layer of the neural network.

9. A parallel variable length coding bitstream length training method comprising:
   (a) generating a training DCT coefficient block by a DCT of training video data, and generating a training quantization DCT coefficient block by quantizing the generated training DCT coefficient block with a training quantization parameter;
   (b) generating a training bitstream by variable length coding the generated training quantization DCT coefficient block; and
   (c) inputting the generated training quantization DCT coefficient block to input layers of a predetermined number of neural networks arranged in parallel, and inputting a length of the generated training bitstreams to output layers of the predetermined number of neural networks so that the predetermined number of neural networks are trained.

10. The method of claim 9, wherein the training video data comprise an arbitrary video sequence, in which if the training video data are DCT transformed, a DCT coefficient block having a variety of values is generated.

11. The method of claim 9, wherein the neural network is a 2-layered MLP.

12. A parallel variable length coding bitstream length selection method comprising:
   (a) inputting a predetermined number of quantization DCT coefficient blocks in parallel to each of a predetermined number of neural networks whose training is finished, quantization DCT coefficients being obtained by quantizing a predetermined number of DCT coefficient blocks with a predetermined number of quantization parameters, and receiving estimation lengths of a predetermined number of bitstreams corresponding to the predetermined number of quantization DCT coefficient blocks from each of the neural networks; and
   (b) receiving a user selection regarding the predetermined number of the received estimation lengths.

13. The method of claim 12, further comprising:
   (c) if any one of the predetermined number of estimation lengths is selected by the user, generating a bitstream by variable length coding a quantization DCT coefficient block corresponding to the selected estimation length.

14. The method of claim 12, wherein the neural network is a 2-layered MLP.

15. A video data compression method comprising:
(a) generating a DCT coefficient block by a DCT of predetermined video data;
(b) generating a quantization DCT coefficient block by quantizing the generated DCT coefficient block, with a predetermined quantization parameter;
(c) inputting the generated quantization DCT coefficient block to a neural network whose training is finished, receiving an estimation length of a bitstream corresponding to the quantization DCT coefficient block from the neural network, and receiving a user selection about the received estimation length; and
(d) if the estimation length is selected by the user, generating a bitstream by variable length coding a quantization DCT coefficient block corresponding to the selected estimation length.

16. A computer readable medium having embodied thereon a computer program for a coding data size selection method,
wherein the coding data size selection method comprises:
(a) inputting predetermined data to a neural network whose training is finished, and receiving an estimation size of coding data corresponding to the predetermined data from the neural network; and
(b) receiving a user selection about the received estimation size.

17. A computer readable medium having embodied thereon a computer program for a variable length coding bitstream length training method,
wherein the variable length coding bitstream length training method comprises:
(a) generating a training DCT coefficient block by a DCT of training video data, and generating a training quantization DCT coefficient block by quantizing the generated training DCT coefficient block with a training quantization parameter;
(b) generating a training bitstream by variable length coding the generated training quantization DCT coefficient block; and
(c) inputting the generated training quantization DCT coefficient block to an input layer of the neural network and inputting the length of the generated training bitstream to an output layer of the neural network.

18. A computer readable medium having embodied thereon a computer program for a parallel variable length coding bitstream length training method,
wherein the parallel variable length coding bitstream length training method comprises:
(a) generating a training DCT coefficient block by a DCT of training video data, and generating a training quantization DCT coefficient block by quantizing the generated training DCT coefficient block with a training quantization parameter;
(b) generating a training bitstream by variable length coding the generated training quantization DCT coefficient block; and
(c) inputting the generated training quantization DCT coefficient block to input layers of a predetermined number of neural networks arranged in parallel, and inputting a length of the generated training bitstreams to output layers of the predetermined number of neural networks so that the predetermined number of neural networks are trained.

19. A computer readable medium having embodied thereon a computer program for a video data compression method,
wherein the video data compression method comprises:
(a) generating a DCT coefficient block by a DCT of predetermined video data;
(b) generating a quantization DCT coefficient block by quantizing the generated DCT coefficient block with a predetermined quantization parameter;
(c) inputting the generated quantization DCT coefficient block to a neural network whose training is finished, receiving an estimation length of a bitstream corresponding to the quantization DCT coefficient block from the neural network, and receiving a user selection about the received estimation length; and
(d) if the estimation length is selected by the user, generating a bitstream by variable length coding a quantization DCT coefficient block corresponding to the selected estimation length.

* * * * *